United States Patent
Schreiber

(10) Patent No.: US 12,066,948 B2
(45) Date of Patent: *Aug. 20, 2024

(54) DYNAMIC BANKING AND BIT SEPARATION IN MEMORIES

(71) Applicant: Advanced Micro Devices, Inc., Santa Clara, CA (US)

(72) Inventor: Russell J. Schreiber, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 156 days.

This patent is subject to a terminal disclaimer.

(21) Appl. No.: 17/699,401

(22) Filed: Mar. 21, 2022

(65) Prior Publication Data

US 2022/0206948 A1    Jun. 30, 2022

Related U.S. Application Data

(63) Continuation of application No. 16/680,491, filed on Nov. 11, 2019, now Pat. No. 11,281,592.

(51) Int. Cl.
| | | |
|---|---|---|
| *G06F 12/08* | (2016.01) | |
| *G06F 12/02* | (2006.01) | |
| *G06F 12/06* | (2006.01) | |
| *G06F 12/0877* | (2016.01) | |
| *G11C 7/10* | (2006.01) | |
| *G11C 8/12* | (2006.01) | |

(52) U.S. Cl.
CPC ...... *G06F 12/0877* (2013.01); *G06F 12/0246* (2013.01); *G06F 12/0661* (2013.01); *G11C 7/1045* (2013.01); *G11C 8/12* (2013.01)

(58) Field of Classification Search
CPC ...... G06F 12/00; G06F 13/00; G06F 12/0877; G06F 12/0246; G06F 12/0661; G11C 7/1045; G11C 8/12
See application file for complete search history.

(56) References Cited

U.S. PATENT DOCUMENTS

| | | | |
|---|---|---|---|
| 5,590,134 A | 12/1996 | Yin | |
| 5,920,898 A * | 7/1999 | Bolyn | G06F 13/161 |
| | | | 711/167 |
| 9,584,696 B2 | 2/2017 | Beck | |
| 2004/0010676 A1* | 1/2004 | Maciukenas | G06F 9/30025 |
| | | | 712/E9.034 |

(Continued)

*Primary Examiner* — Tuan V Thai
(74) *Attorney, Agent, or Firm* — Volpe Koenig

(57) ABSTRACT

Memories that are configurable to operate in either a banked mode or a bit-separated mode. The memories include a plurality of memory banks; multiplexing circuitry; input circuitry; and output circuitry. The input circuitry inputs at least a portion of a memory address and configuration information to the multiplexing circuitry. The multiplexing circuitry generates read data by combining a selected subset of data corresponding to the address from each of the plurality of memory banks, the subset selected based on the configuration information, if the configuration information indicates a bit-separated mode. The multiplexing circuitry generates the read data by combining data corresponding to the address from one of the memory banks, the one of the memory banks selected based on the configuration information, if the configuration information indicates a banked mode. The output circuitry outputs the generated read data from the memory.

20 Claims, 10 Drawing Sheets

(56) References Cited

U.S. PATENT DOCUMENTS

| | | |
|---|---|---|
| 2007/0214335 A1 | 9/2007 | Bellows et al. |
| 2014/0129789 A1* | 5/2014 | Deutschle ........... G06F 12/0815 |
| | | 711/162 |
| 2016/0179539 A1* | 6/2016 | Ould-Ahmed-Vall ...................... |
| | | G06F 9/30036 |
| | | 712/208 |

* cited by examiner

US 12,066,948 B2

DYNAMIC BANKING AND BIT SEPARATION IN MEMORIES

CROSS REFERENCE TO RELATED APPLICATIONS

This application claims the benefit of U.S. patent application Ser. No. 16/680,491 filed Nov. 11, 2019, the content of which is hereby incorporated by reference herein.

BACKGROUND

Computer memory devices, such as static random access memory, (SRAM), dynamic random access memory (DRAM), and the like, are typically organized using multiple banks.

Data stored in computer memory devices is susceptible to various sources of error. Errors sometimes occur in data stored in memory due to flaws in the design of the memory or its associated circuitry, component breakage, or other defects. Such errors are referred to as "hard errors." On the other hand, errors sometimes occur in the data in the absence of design flaws, breakage or defects. Such errors are referred to as "soft errors."

In some cases, soft errors occur due to particle strikes on the physical structure of the memory, such as where an alpha particle or cosmic ray secondary neutron strikes a semiconductor structure which stores an information bit in the memory. Such particle strikes change (or "flip") the value of the bit in some cases, resulting in a single-bit error in the item of data of which the bit forms a part. For example, if the flipped bit is a binary digit of a value stored in memory, the particle strike results in a single-bit error in the value. In some cases, a particle strike can change the value of two (or more) adjacent structures storing bits of information, potentially changing the value of both bits. In cases where both changed bits are part of the same item of data, this results in a multiple-bit error. For example, if the flipped bits are binary digits of the same value stored in memory, the particle strike results in a multiple-bit error in the value.

Various techniques are available to address soft errors, including error correcting codes (ECC). Typical ECCs are able to correct single-bit errors, and to detect (but not correct) multiple-bit errors.

BRIEF DESCRIPTION OF THE DRAWINGS

A more detailed understanding can be had from the following description, given by way of example in conjunction with the accompanying drawings wherein.

DETAILED DESCRIPTION

Figure 1:
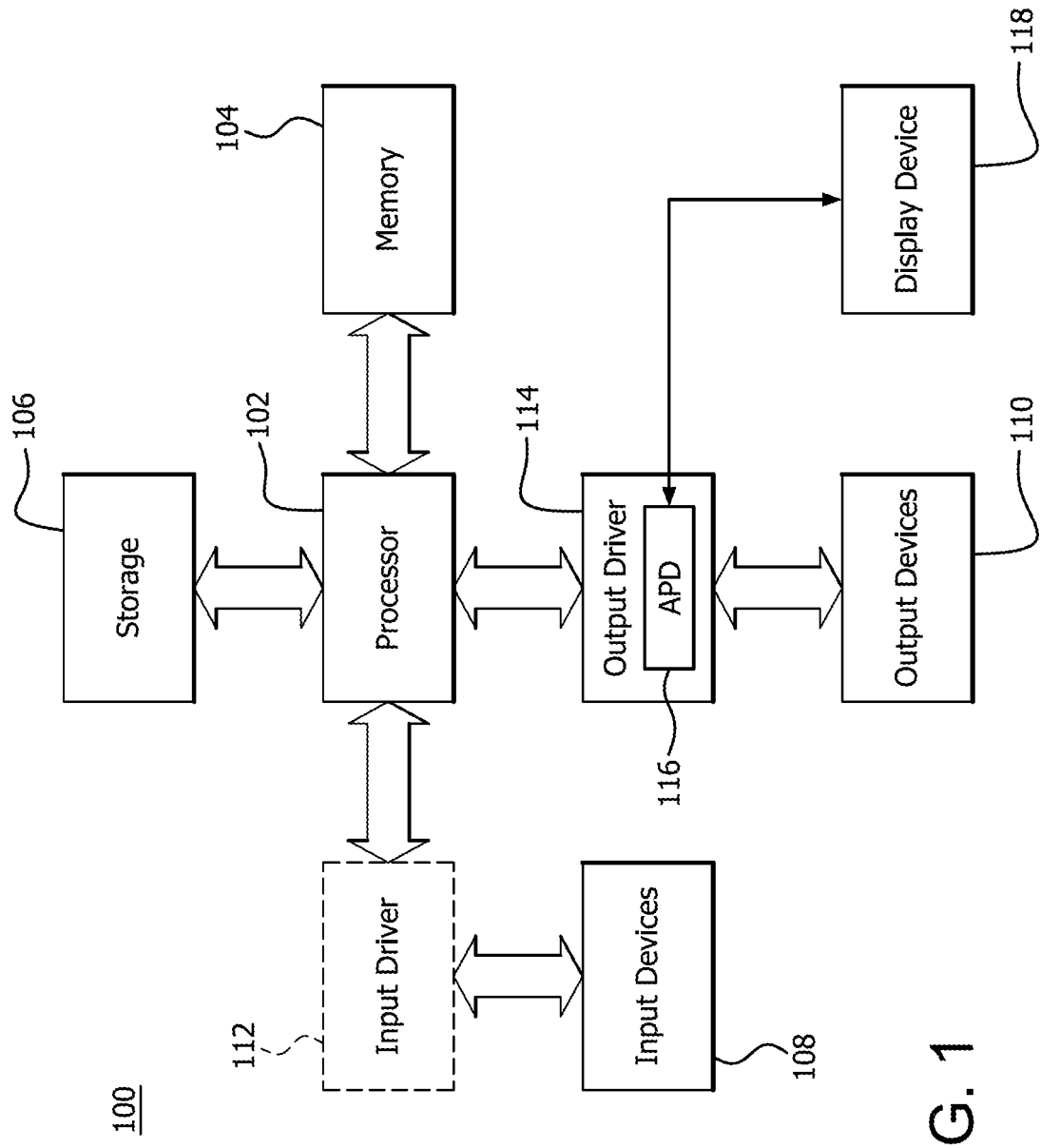
FIG. 1 is a block diagram of an example device in which one or more features of the disclosure can be implemented.

Some implementations provide a memory that is configurable to operate in either a banked mode or a bit-separated mode. The memory includes a plurality of memory banks; multiplexing circuitry; input circuitry; and output circuitry. The input circuitry inputs at least a portion of a memory address to the multiplexing circuitry, and inputs configuration information to the multiplexing circuitry. The multiplexing circuitry generates read data by combining a selected subset of data corresponding to the address from each of the plurality of memory banks, the subset selected based on the configuration information, if the configuration information indicates a bit-separated mode. The multiplexing circuitry generates the read data by combining data corresponding to the address from one of the memory banks, the one of the memory banks selected based on the configuration information, if the configuration information indicates a banked mode. The output circuitry outputs the generated read data from the memory.

Some implementations provide a method for reading data from a memory that is configurable to operate in either a banked mode or a bit-separated mode. The method includes inputting at least a portion of a memory address to multiplexing circuitry, and inputting configuration information to the multiplexing circuitry. The method also includes generating read data by combining a selected subset of data corresponding to the address from each of a plurality of memory banks, the subset selected by the multiplexing circuitry based on the configuration information, if the configuration information indicates a bit-separated mode. The method also includes generating the read data by combining data corresponding to the address from one of the memory banks, the one of the memory banks selected by the multiplexing circuitry based on the configuration information, if the configuration information indicates a banked mode. The method also includes outputting the generated read data from the memory.

Some implementations provide a memory that is configurable to operate in either a banked mode or a bit-separated mode. The memory includes a plurality of memory banks; multiplexing circuitry; and input circuitry. The input circuitry inputs write data to the multiplexing circuitry, inputs at least a portion of a memory address to the multiplexing circuitry, and inputs configuration information to the multiplexing circuitry. The multiplexing circuitry writes a selected subset of the write data to each of the plurality of memory banks, the subset selected based on the configuration information, if the configuration information indicates a bit-separated mode. The multiplexing circuitry writes the write data to a selected one of the plurality of memory banks, the one of the memory banks selected based on the configuration information, if the configuration information indicates a banked mode.

Some implementations provide a method for writing data to a memory that is configurable to operate in either a banked mode or a bit-separated mode. The method includes inputting write data to multiplexing circuitry; inputting at least a portion of a memory address to the multiplexing circuitry; and inputting configuration information to the multiplexing circuitry. The method also includes writing a selected subset of the write data to each of a plurality of memory banks, the subset selected by the multiplexing circuitry based on the configuration information, if the configuration information indicates a bit-separated mode. The method also includes writing the write data to a selected one of the plurality of memory banks, the one of the plurality of memory banks selected by the multiplexing circuitry based on the configuration information, if the configuration information indicates a banked mode.

FIG. 1 is a block diagram of an example device 100 in which one or more features of the disclosure can be implemented. The device 100 can include, for example, a computer, a gaming device, a handheld device, a set-top box, a television, a mobile phone, or a tablet computer. The device 100 includes a processor 102, a memory 104, a storage 106, one or more input devices 108, and one or more output devices 110. The device 100 can also optionally include an input driver 112 and an output driver 114. It is understood that the device 100 can include additional components not shown in FIG. 1.

In various alternatives, the processor 102 includes a central processing unit (CPU), a graphics processing unit (GPU), a CPU and GPU located on the same die, or one or more processor cores, wherein each processor core can be a CPU or a GPU. In various alternatives, the memory 104 is located on the same die as the processor 102, or is located separately from the processor 102. The memory 104 includes a volatile or non-volatile memory, for example, random access memory (RAM), dynamic RAM, or a cache.

The storage 106 includes a fixed or removable storage, for example, a hard disk drive, a solid state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present. The output driver 116 includes an accelerated processing device ("APD") 116 which is coupled to a display device 118. The APD accepts compute commands and graphics rendering commands from processor 102, processes those compute and graphics rendering commands, and provides pixel output to display device 118 for display. As described in further detail below, the APD 116 includes one or more parallel processing units to perform computations in accordance with a single-instruction-multiple-data ("SIMD") paradigm. Thus, although various functionality is described herein as being performed by or in conjunction with the APD 116, in various alternatives, the functionality described as being performed by the APD 116 is additionally or alternatively performed by other computing devices having similar capabilities that are not driven by a host processor (e.g., processor 102) and provides graphical output to a display device 118. For example, it is contemplated that any processing system that performs processing tasks in accordance with a SIMD paradigm may perform the functionality described herein. Alternatively, it is contemplated that computing systems that do not perform processing tasks in accordance with a SIMD paradigm performs the functionality described herein.

Figure 2:
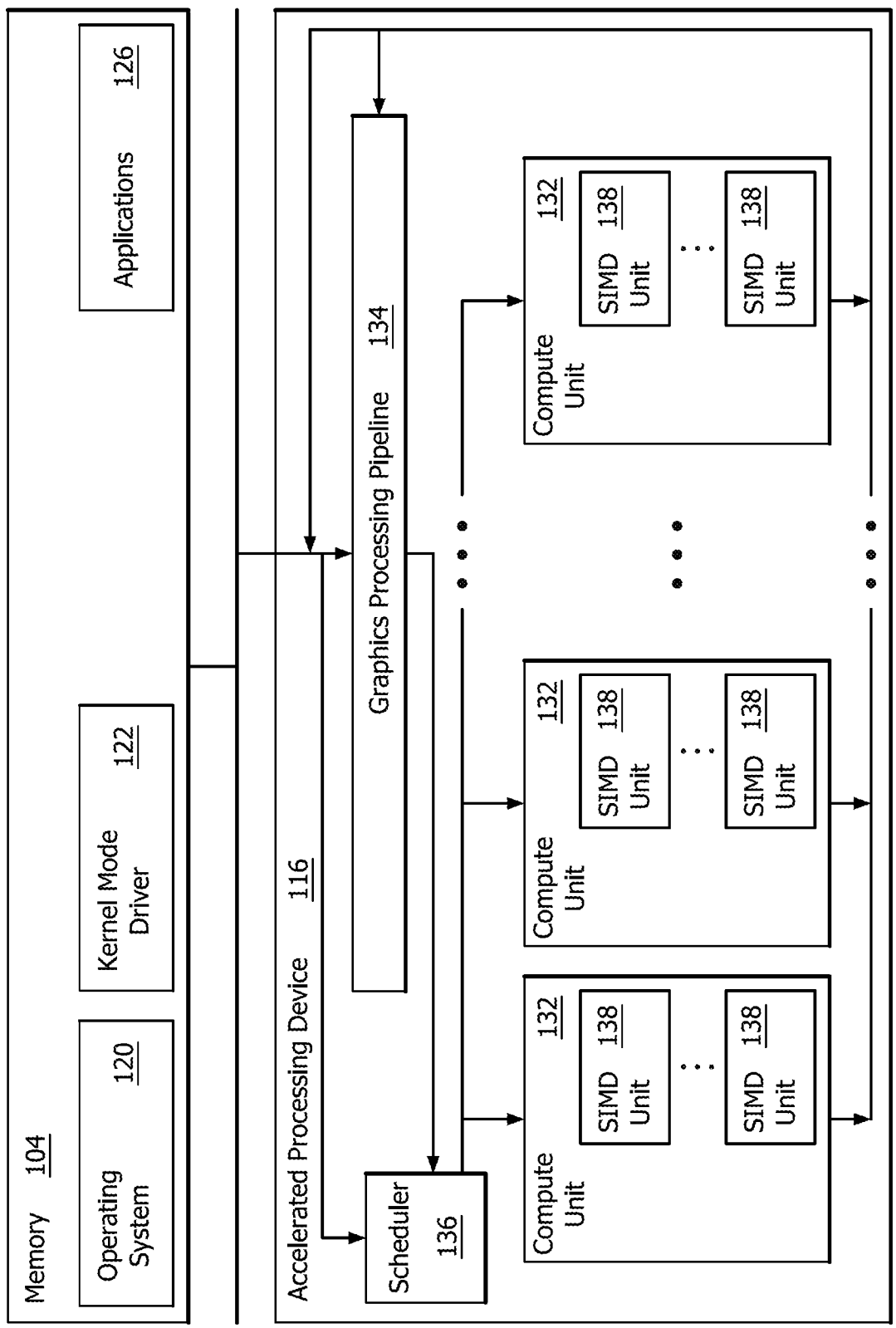
FIG. 2 is a block diagram of the device of FIG. 1, illustrating additional detail.

FIG. 2 is a block diagram of the device 100, illustrating additional details related to execution of processing tasks on the APD 116. The processor 102 maintains, in system memory 104, one or more control logic modules for execution by the processor 102. The control logic modules include an operating system 120, a kernel mode driver 122, and applications 126. These control logic modules control various features of the operation of the processor 102 and the APD 116. For example, the operating system 120 directly communicates with hardware and provides an interface to the hardware for other software executing on the processor 102. The kernel mode driver 122 controls operation of the APD 116 by, for example, providing an application programming interface ("API") to software (e.g., applications 126) executing on the processor 102 to access various functionality of the APD 116. The kernel mode driver 122 also includes a just-in-time compiler that compiles programs for execution by processing components (such as the SIMD units 138 discussed in further detail below) of the APD 116.

The APD 116 executes commands and programs for selected functions, such as graphics operations and non-graphics operations that may be suited for parallel processing. The APD 116 can be used for executing graphics pipeline operations such as pixel operations, geometric computations, and rendering an image to display device 118 based on commands received from the processor 102. The APD 116 also executes compute processing operations that are not directly related to graphics operations, such as operations related to video, physics simulations, computational fluid dynamics, or other tasks, based on commands received from the processor 102.

The APD 116 includes compute units 132 that include one or more SIMD units 138 that perform operations at the request of the processor 102 in a parallel manner according to a SIMD paradigm. The SIMD paradigm is one in which multiple processing elements share a single program control flow unit and program counter and thus execute the same program but are able to execute that program with different data. In one example, each SIMD unit 138 includes sixteen lanes, where each lane executes the same instruction at the same time as the other lanes in the SIMD unit 138 but can execute that instruction with different data. Lanes can be switched off with predication if not all lanes need to execute a given instruction. Predication can also be used to execute programs with divergent control flow. More specifically, for programs with conditional branches or other instructions where control flow is based on calculations performed by an individual lane, predication of lanes corresponding to control flow paths not currently being executed, and serial execution of different control flow paths allows for arbitrary control flow.

The basic unit of execution in compute units 132 is a work-item. Each work-item represents a single instantiation of a program that is to be executed in parallel in a particular lane. Work-items can be executed simultaneously as a "wavefront" on a single SIMD processing unit 138. One or more wavefronts are included in a "work group," which includes a collection of work-items designated to execute the same program. A work group can be executed by executing each of the wavefronts that make up the work group. In alternatives, the wavefronts are executed sequentially on a single SIMD unit 138 or partially or fully in parallel on different SIMD units 138. Wavefronts can be thought of as the largest collection of work-items that can be executed simultaneously on a single SIMD unit 138. Thus, if commands received from the processor 102 indicate that a particular program is to be parallelized to such a degree that the program cannot execute on a single SIMD unit 138 simultaneously, then that program is broken up into wavefronts which are parallelized on two or more SIMD units 138 or serialized on the same SIMD unit 138 (or both parallelized and serialized as needed). A scheduler 136 performs operations related to scheduling various wavefronts on different compute units 132 and SIMD units 138.

The parallelism afforded by the compute units 132 is suitable for graphics related operations such as pixel value calculations, vertex transformations, and other graphics operations. Thus in some instances, a graphics pipeline 134, which accepts graphics processing commands from the processor 102, provides computation tasks to the compute units 132 for execution in parallel.

The compute units 132 are also used to perform computation tasks not related to graphics or not performed as part of the "normal" operation of a graphics pipeline 134 (e.g., custom operations performed to supplement processing performed for operation of the graphics pipeline 134). An application 126 or other software executing on the processor 102 transmits programs that define such computation tasks to the APD 116 for execution.

Memory bandwidth and/or power consumption can be optimized or otherwise traded off versus reliability against soft errors using multiple banks of memory.

Figure 3:
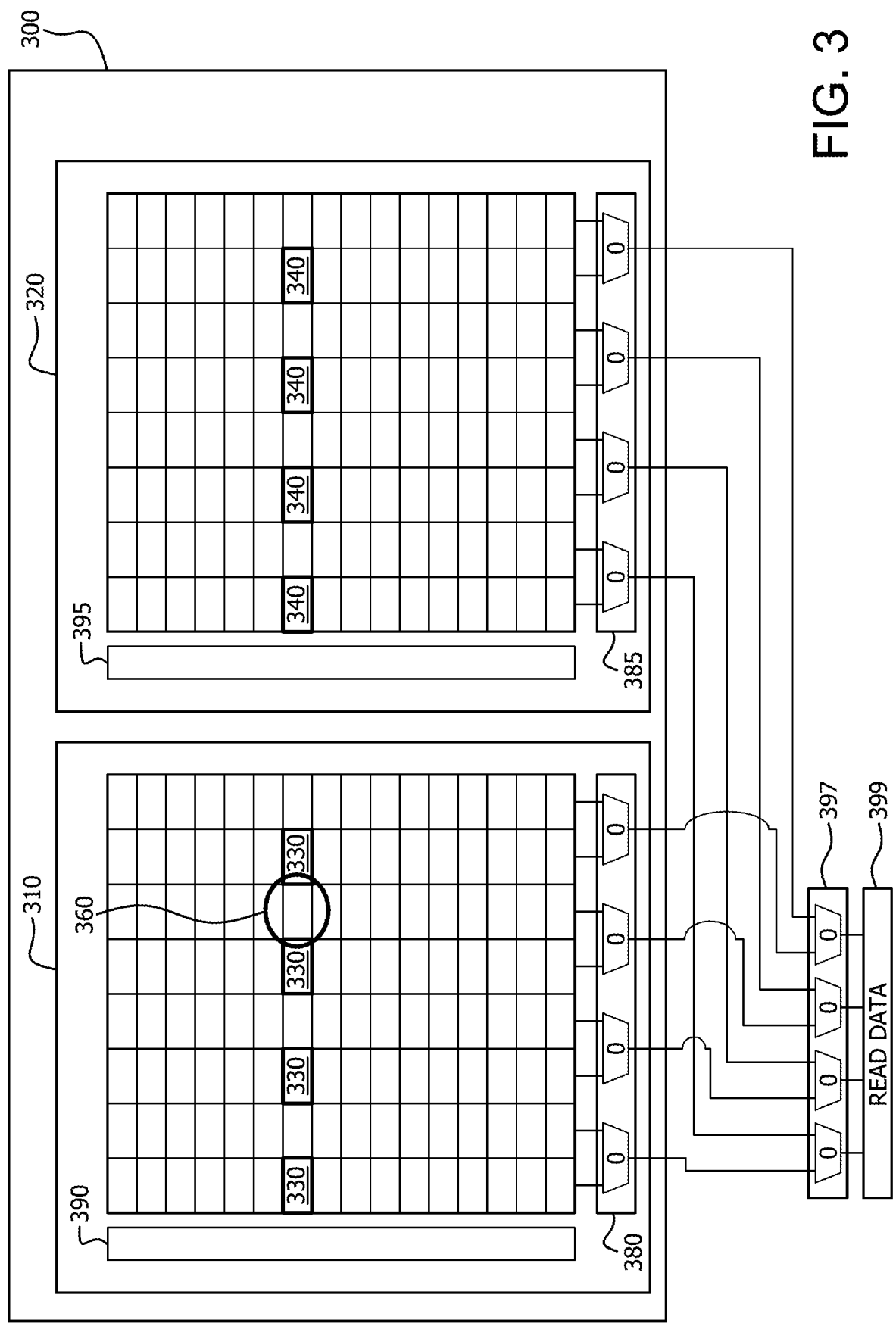
FIG. 3 is a block diagram illustrating an example memory configured for banked read operations.

FIG. 3 is a block diagram illustrating an example memory 300. Memory 300 is configured for banked read operations, and is implemented in any suitable way, using any suitable hardware components. In this example, memory 300 is implemented in an L2 cache of processor 102 as shown and described with respect to FIG. 1. Other implementations include a substantially similar memory implemented in any suitable way, such as in a cache memory of APD 116, in memory 104, and so forth. In this example, memory 300 is implemented in a cache memory, however other implementations include any other suitable type of memory.

Memory 300 stores memory entries in rows and columns of memory devices (e.g., RAM). In this example, memory 300 includes two banks 310, 320 of such memory devices. Memory 300 also includes row decoders 390, 395 and column multiplexers 380, 385. Memory devices are selected for access (e.g., reading in this example) by addressing the row and column at which each of the desired memory devices are located in memory 300.

A memory device is readable, for example, by inputting address bits of the corresponding row or rows to row decoders 390, 395, and by addressing the corresponding column or columns to column multiplexers 380, 385. In this example, the address bits are portions of an address of a memory entry stored in memory 300.

The address or portion of an address applied to row decoders 390, 395 is referred to as a row address, and the address or portion of an address applied to column multiplexers 380, 385 is referred to as a column address. In this example, the bits of the row address set decoding circuitry in the row decoders 390, 395 to select a particular row or rows of banks 310 and 320 for reading, and the bits of the column address set multiplexing circuitry in the column multiplexers 380, 385 to select a particular column or columns of banks 310 and 320 for reading.

The information stored in memory devices at the corresponding row and column addresses is output from memory 300 to bank multiplexers 397, which are addressed to select the output from bank 310 or bank 320. Bank multiplexers 397 output the information as read data 399.

The address or portion of an address applied to bank multiplexers 397 is referred to as a bank index. Because there are two banks in this example, the bank index is a single bit. However any suitable number of bits is usable in other implementations. In some implementations, the bank index is the least significant bit (LSB) of the address of the desired memory entry. Bank multiplexers 397 are located outside of memory 300 in this example. However in some implementations bank multiplexers 397 are located inside of memory 300.

To illustrate an example operation, two memory entries 330, 340 are stored in banks 310 and 320 respectively, and it is desired to read memory entry 330. Memory entry 330 is stored completely in memory devices in even columns of a single row of bank 310, interleaved with other memory entries. Memory entry 340 is stored completely in bank 320 (i.e., in memory devices at column and row addresses corresponding to memory entry 330). In this example, a subset of address bits corresponding to the row address of memory entry 330 is input to row decoder 390 and a different subset of the address bits corresponding to the column address of memory entry 330 is input to column multiplexer 380. In this example, column multiplexers 380 include several 2:1 multiplexers which each select either an odd column, or even column, of bank 310. Accordingly, the column address for memory entry 330 is used to set each multiplexer of column multiplexers 380 to output from memory devices in the even columns of bank 310, illustrated in FIG. 3 by a select value of "0" for each of the multiplexers, because entry 330 is stored in memory devices in the even columns (starting with column 0) of the selected row of bank 310.

Because memory entry 330 is stored completely in bank 310, memory entry 330 is read by inputting a subset of address bits corresponding to the bank index to bank multiplexers 397, which sets all of the multiplexers of bank multiplexers 397 to output read data 399 from bank 310 only. This is illustrated in FIG. 3 by a select value of "0" for each of the multiplexers. If it were desired to read memory entry 340 from bank 320, the bank index would set all of the multiplexers of bank multiplexers 397 to a select value of "1". The bank index is only one bit of the memory address in this example because there are only two banks, and bank multiplexers 397 are either all set to "0" or all set to "1". In other implementations, any suitable number of bits is usable for the bank index.

In some implementations, configuring a cache memory for independent access to banks 310, 320 increases memory bandwidth by facilitating simultaneous access to a different memory entry in the other bank (e.g., by adding a second output data bus and a second set of bank multiplexers). This concept is extendible to any suitable number of banks. The number of banks accessible independently in a memory is referred to as the banking of the memory.

In the example of FIG. 3, a particle strike impacts an area 360 of bank 310 which includes two bit storage locations of memory entry 330 (a "double strike"). Accordingly, two bits of memory entry 330 are changed, creating a double-bit error in memory entry 330. This double-bit error is non-correctable in typical single-error correcting and double-error detecting (SEC-DED) ECC memory systems.

Reliability against soft errors due to particle strikes can be optimized or otherwise traded off versus reliability against soft errors using multiple banks of memory.

Figure 4:
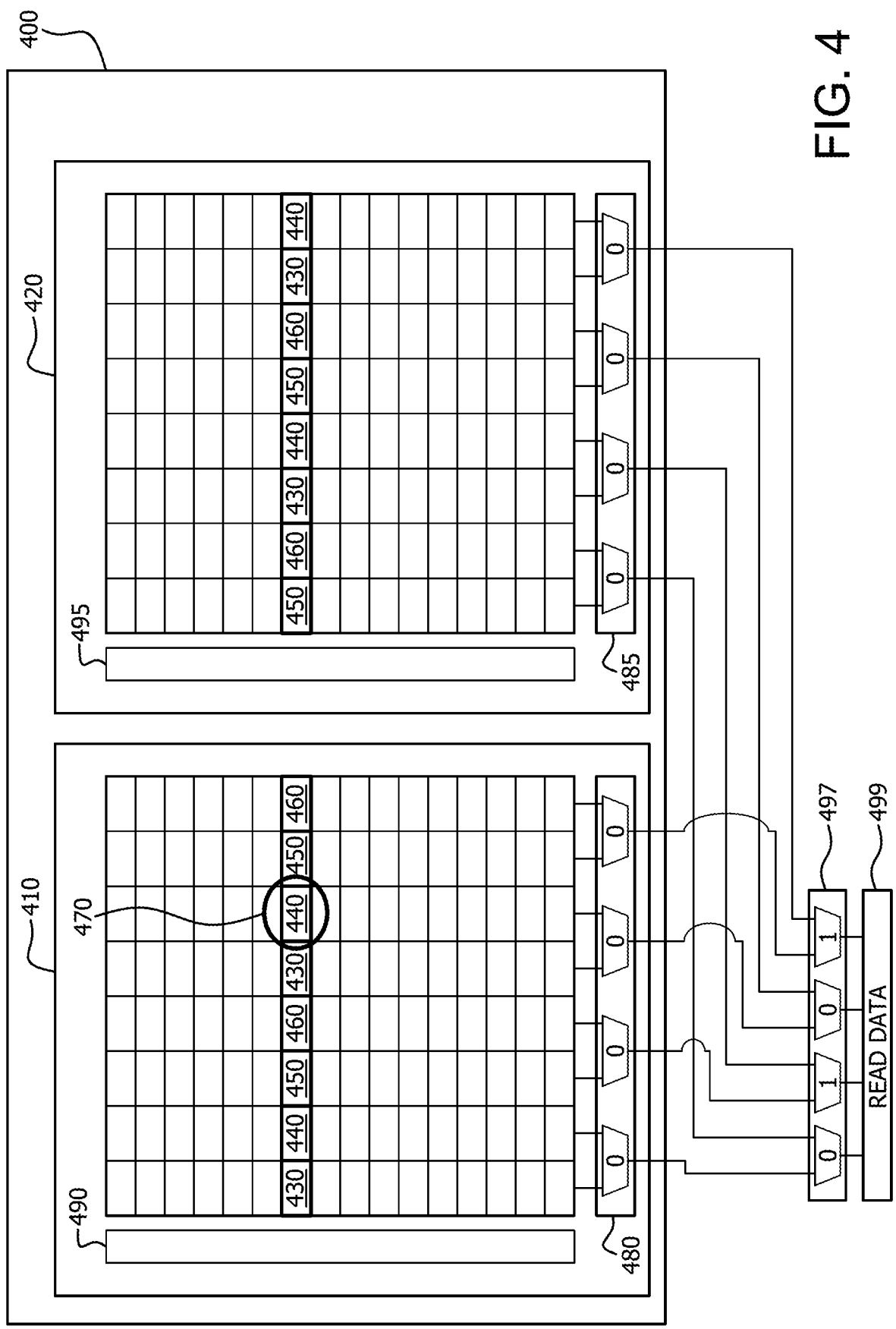
FIG. 4 is a block diagram illustrating an example memory configured for bit-separated read operations.

FIG. 4 is a block diagram illustrating an example memory 400. In this example, memory 400 is identical to memory 300, shown and described with respect to FIG. 3, except in that it is reconfigured for bit-separated read operations. Memory 400 is implemented in any suitable way, using any suitable hardware components. In this example, memory 400 is implemented in an L2 cache of processor 102 as shown and described with respect to FIG. 1. Other implementations include a substantially similar memory implemented in any suitable way, such as in a cache memory of APD 116, in memory 104, and so forth. In this example, memory 400 is implemented in a cache memory; however other implementations include any other suitable type of memory.

Memory 400 stores memory entries in memory devices in rows and columns of memory banks (e.g., RAM), and is similar or identical to memory 300.

Memory entry 430 is stored partly in bank 410 and partly in bank 420, interleaved with other memory entries 440, 450 and 460. Memory entry 440 is also stored partly in bank 410 and partly in bank 420, interleaved with other memory entries 430, 450 and 460.

To illustrate an example operation, two memory entries 430, 440 are spread across two banks in order to increase bit separation (i.e., to further "space out" the bits of the memory entry), which reduces the chances of a double-bit error in some cases. Memory entries 430 and 440 share row and column addresses and are both stored in both banks 410, 420.

In this example, a subset of address bits corresponding to the row address of memory entry 430 is input to row decoders 490, 495, and a different subset of the address bits corresponding to the column address of memory entry 430 is input to column multiplexers 480, 485. In this example, column multiplexers 480, 485 include several 2:1 multiplexers which each select either an odd column, or even column, of banks 410, 420. Accordingly, the column address for memory entry 430 is used to set each multiplexer of column multiplexers 480, 485 to output from the even columns of banks 410, 420, illustrated in FIG. 4 by a select value of "0" for each of the multiplexers, because entry 430 is stored in every other even column of the selected row of both of banks 410, 420.

Because memory entry 430 is stored in memory devices at every other even column of bank 410 and the alternate even columns of bank 420, as shown in FIG. 4, in bank 420, memory entry 430 is read by inputting a subset of the address bits corresponding to the bank index to bank multiplexers 497, which sets every other multiplexer of bank multiplexers 497 to output read data 499 from bank 410 or bank 420, respectively. Thus, the leftmost multiplexer of bank multiplexers 497 is set to output from bank 410, illustrated in FIG. 4 by a select value of "0". The next leftmost multiplexer of bank multiplexers 497 is set to output from bank 420, illustrated in FIG. 4 by a select value of "1". The select values of each multiplexer of bank multiplexers 497 alternate between each of banks 410 and 420 as shown in FIG. 4. Bank multiplexers 497 output memory entry 430 as read data 499.

If it were desired to read memory entry 450, the bank index would set all of the multiplexers of bank multiplexers 497 to the opposite select values. Thus, the leftmost multiplexer of bank multiplexers 497 would be set to output from bank 420; e.g., by a select value of "1". The next leftmost multiplexer of bank multiplexers 497 would be set to output from bank 410; e.g., by a select value of "0", and so forth. The bank index is only one bit of the memory address in this example because the bit separation of each memory entry requires only two select settings for bank multiplexers 497; e.g., "0101" or "1010". In other implementations, any suitable number of bits is usable for the bank index.

In some cases, configuring a cache memory for simultaneous access to both of banks 410, 420 in this way increases the power needed to access each memory entry, and/or reduces memory bandwidth as compared with memory 300, by requiring memory entries 430 and 440 to both be accessed any time one is accessed.

In the example of FIG. 4, a particle strike impacts an area 470 of bank 410 which includes one bit storage location each of memory entries 430, 440, and 450. Accordingly, one bit of each of memory entries 430, 440, and 450 are changed, creating a single-bit error in memory entry 430, a single-bit error in memory entry 440, and a single bit error in 450. These single-bit errors are correctable in typical SEC-DED ECC memory systems.

Figure 5:
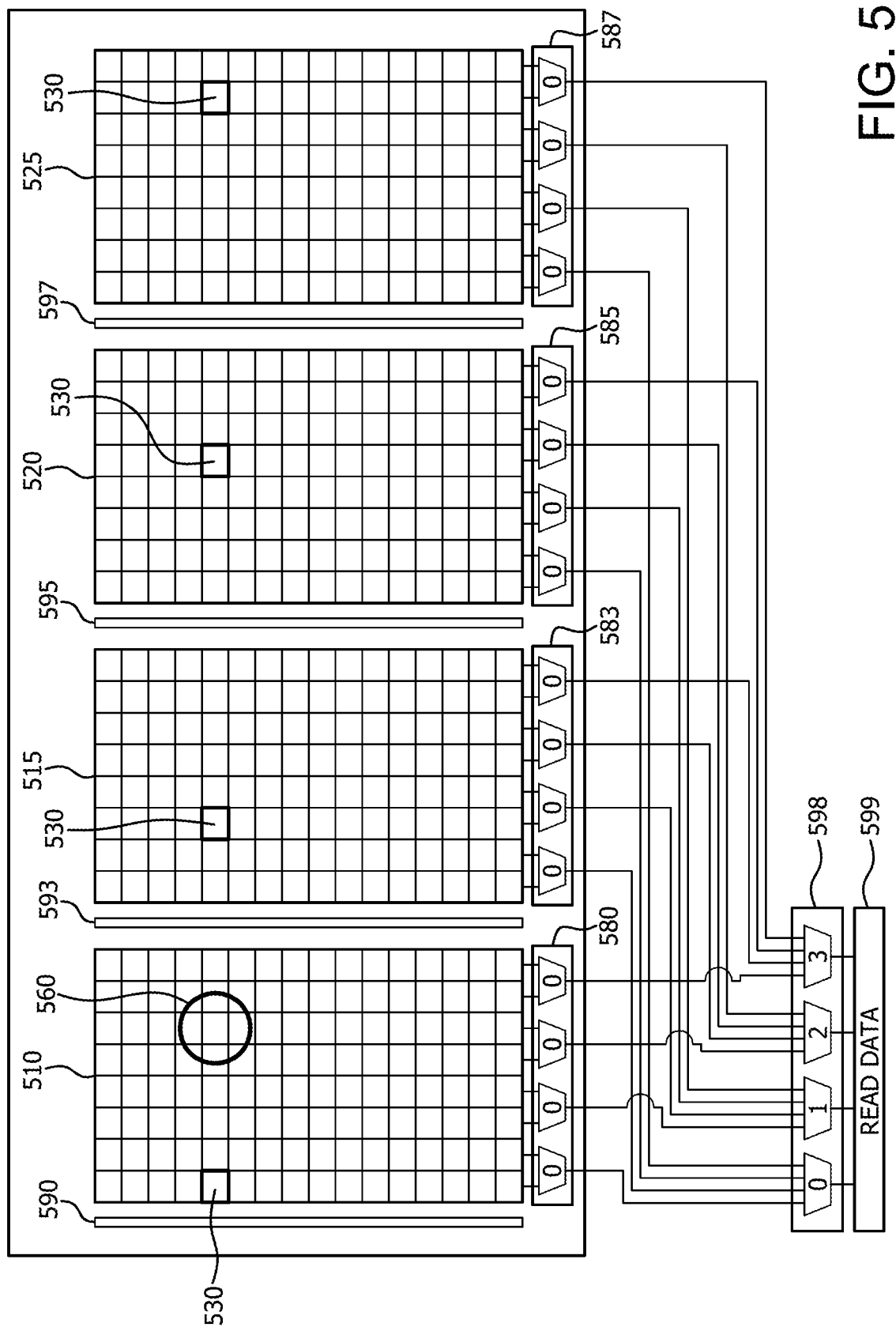
FIG. 5 is a block diagram illustrating another example memory configured for bit-separated read operations.

Some implementations provide further bit separation by spreading each memory entry over more than two banks. For example, FIG. 5 is a block diagram illustrating an example memory 500. Memory 500 is configured for bit-separated read operations, and is similar to memory 400 as shown and described with respect to FIG. 4, except in that it includes four banks, 510, 515, 520, 525. A memory entry 530 is stored partly in bank 510, partly in bank 515, partly in bank 520, and partly in bank 525, in the same row. It is possible to store up to seven other memory entries across banks 510, 515, 520, 525 in the memory devices of that row that are not occupied by memory entry 530 (i.e., interleaved 8:1).

In this example, a subset of address bits corresponding to the row address of memory entry 530 is input to row decoders 590, 593, 595, 597, and a different subset of the address bits corresponding to the column address of memory entry 530 is input to column multiplexers 580, 583, 585, 587. In this example, column multiplexers 580, 583, 585, 587 include several 2:1 multiplexers which each select either an odd column, or even column, of banks 510, 515, 520, 525. Accordingly, the column address for memory entry 530 is used to set each multiplexer of column multiplexers 510, 515, 520, 525 to output from the even columns of banks 510, 515, 520, 525, illustrated in FIG. 4 by an select value of "0" for each of the multiplexers, because entry 530 is stored in memory devices in certain even columns of the selected row of each of banks 510, 515, 520, 525.

Because memory entry 530 is stored in different even columns of banks 510, 515, 520, 525, as shown in FIG. 5, memory entry 530 is read by inputting a subset of the address bits corresponding to the bank index to bank multiplexers 598 which sets each multiplexer of bank multiplexers 598 to output read data 599 from a different odd column of banks 510, 515, 520, 525, respectively. Thus, the leftmost multiplexer of bank multiplexers 599 is set to output from bank 510, illustrated in FIG. 5 by an select value of "0". The next leftmost multiplexer of bank multiplexers 598 is set to output from bank 515, illustrated in FIG. 5 by an select value of "1". The next leftmost multiplexer of bank multiplexers 598 is set to output from bank 520 by an select value of "2". The next leftmost multiplexer of bank multiplexers 598 is set to output from bank 525 by an select value of "3". It is noted that because there are four banks, for bit-separated operation, there are four possible combinations of bank multiplexer settings for bank multiplexers 599. Accordingly, the bank index, for bit-separated operation, requires at least two bits (e.g., binary 00, 01, 10, 11 corresponding to decimal values 0, 1, 2, 3). Bank multiplexers 598 output memory entry 530 as read data 599.

In the example of FIG. 5, the bit separation is eight, as opposed to FIG. 4, where the bit separation is four. In some cases this increases the robustness of memory 500 against particle strike errors as compared with the robustness of memory 400, at the cost of reduced memory bandwidth and increased power consumption. For example, a particle strike impacting an area 560 of bank 510 does not impact any bits of memory entry 530 (and would cause only single bit errors in some other entries interleaved with entry 530 at the same row address).

In some cases, if memory 500 were configured (or reconfigured) for independent access of the four banks, 510, 515, 520, 525 (i.e., with a banking of 4), memory 500 would increase memory performance in terms of bandwidth and/or power consumption as compared with memory 400. For example, if memory entry 530 were stored in even rows of bank 510 only, memory entry 530 could be read by inputting a bank index to bank multiplexers 598 which sets each multiplexer of bank multiplexers 599 to output memory entry 530 from a different even column of bank 510 only. In this example, each multiplexer of bank multiplexers 598 would be set to a decimal value of 0 (or a binary value of "00"). It is noted that because there are four banks, for banked operation, there are four possible combinations of bank multiplexer settings for bank multiplexers 599 (e.g., all set to 0, all set to 1, all set to 2, and all set to 3 (decimal). Accordingly, the bank index, for banked operation, requires at least two bits (e.g., binary 00, 01, 10, 11 corresponding to decimal values 0, 1, 2, 3).

In some cases, configuring memory 500 for independent access to an entry in one of banks 510, 515, 520, 525 in this way increases memory bandwidth by facilitating simultaneous access to a different memory entry in a different bank. Such implementations may include additional hardware, such as additional sets of bank multiplexers similar to bank multiplexers 598.

In some cases, the choice of whether to configure a memory for independent bank access as in FIG. 3, or with increased bit separation as in FIGS. 4 and 5, depends on whether robustness against soft errors due to particle strikes or performance in terms of memory bandwidth and/or power consumption is prioritized for the desired application of the memory. For example, server applications may prioritize reliability, whereas gaming computer applications may prioritize memory bandwidth.

Figure 6:
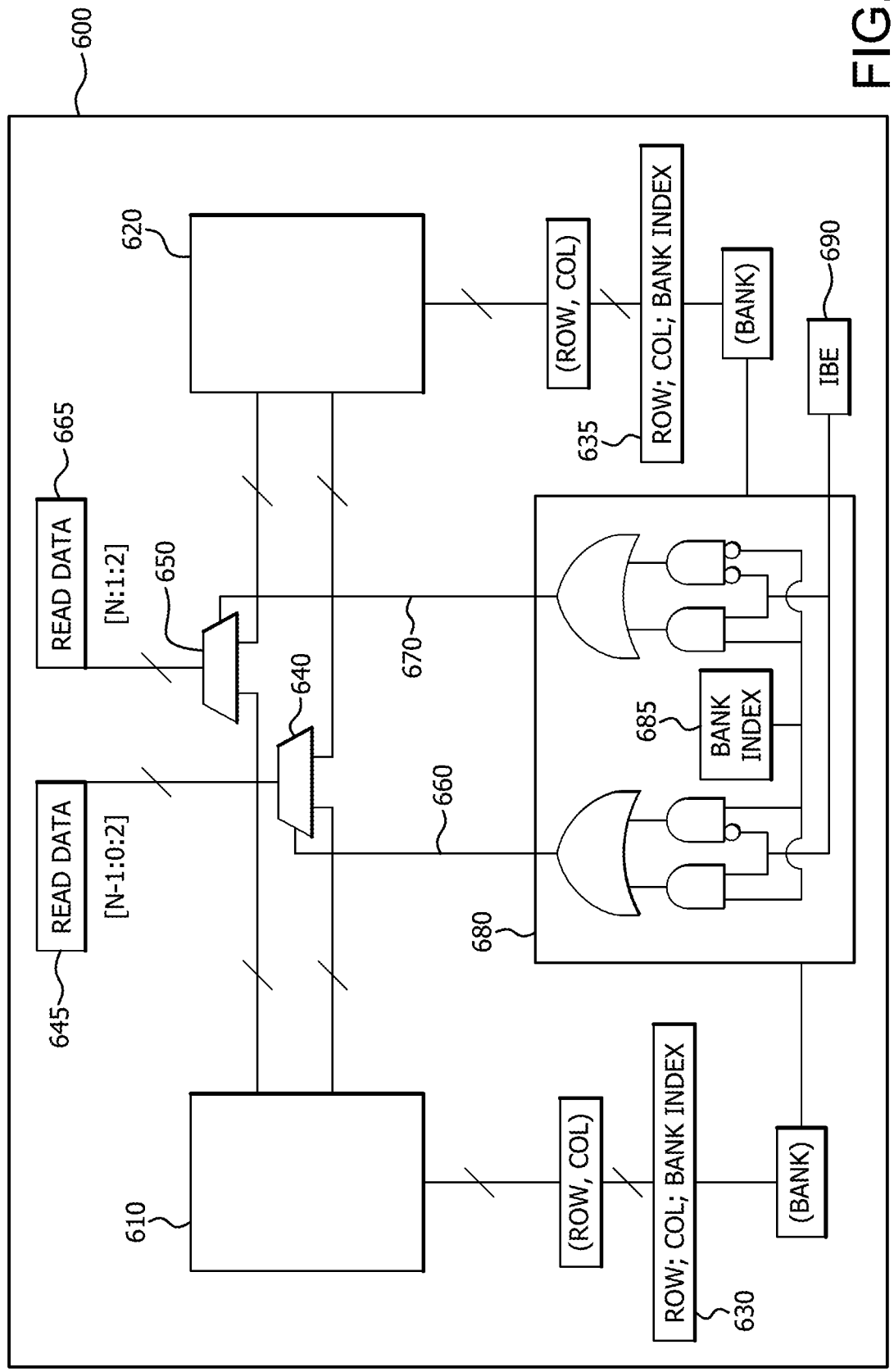
FIG. 6 is a block diagram illustrating an example memory configurable for banked or bit-separated write operations.

FIG. 6 is a schematic diagram illustrating a memory 600, similar to memories 300 and 400, as shown and described with respect to FIGS. 3 and 4. Memory 600 also includes example circuitry facilitating configurability between banked read operation (e.g., as illustrated by FIG. 3) and increased bit separated read operation (e.g., as illustrated by FIG. 4). Such configurability is applicable to memories 300, 400, and 500, as shown and described with respect to FIGS. 3, 4, and 5, or any other suitable memory, and analogous configurability is applicable to write operations, as discussed further herein. In some cases, such configurability has the advantage of enabling users to configure the tradeoff between performance and robustness, of enabling programs to dynamically configure the tradeoff, or of enabling the chip manufacturer to bin processors for different markets, for example. In some implementations, configuring or reconfiguring memory 600 between banked operation and increased bit separated operation is performed at boot time, or following a memory flush, in order to avoid data corruption.

Memory 600 includes bank 610 and bank 620. The rows and columns of banks 610 and 620 are accessed by inputting a subset of the bits of memory address 630 or memory address 635 to row decoders and column multiplexers of banks 610 and 620 respectively. Each of banks 610, 620 outputs the bits stored at memory lines and columns corresponding to address 630 and 635, respectively, to bank multiplexer 640 and bank multiplexer 650.

Bank multiplexer 640 outputs read data 645 which includes each even bit of the output from either bank 610 or bank 620, depending on mux select signal 660. Bank multiplexer 650 outputs read data 655 which includes each odd bit of the output from either bank 610 or bank 620, depending on mux select signal 670. Read data 645 and read data 655 are combined to provide the result of a memory lookup at address 630. Bank multiplexers 640, 650 are shown as two units merely for ease of description. It is noted that corresponding multiplexing could alternately be described as a single unit which includes multiple multiplexers (similar to bank multiplexers 397, 497, 598 as shown and described in FIGS. 3, 4, and 5, respectively), or could be described in terms of a plurality of 2:1 multiplexers.

Mux select signals 660, 670 are generated by configuration circuitry 680 based on bank index signal 685, and independent banking enable (IBE) signal 690. In this example, bank index signal 685 is a subset of the address bits (e.g., one bit) of address 630 or address 635, depending on which address is being used in the operation. Independent banking enable signal 690 sets configuration circuitry 680 to use bank index signal 685 either as a bank select (for banked operation, as in FIG. 3) or to select which bits of each bank will be combined to generate the read data (for bit-separated operation, as in FIG. 4). Configuration circuitry 680 is illustrated using an example combination of symbolic logic, however it is noted that any suitable logic is usable in other implementations.

In this example, independent banking enable signal 690 sets memory 600 to operate in either a banked mode, or a bit separation mode. Because there are two modes in this example, independent banking enable signal 690 is one bit wide. Bank index 685 sets which bank output is selected by multiplexers 640 and 650 in conditions where independent banking enable signal 690 configures memory 600 to operate in banked mode, and sets which bits are output from corresponding row addresses of both bank 610 and bank 620 in conditions where independent banking enable signal 690 configures memory 600 to operate in increased bit separation mode. Because there are two banks in this example, bank index 685 is one bit wide. Table 1 illustrates the possible combinations of bank index signal 685 and independent banking enable signal 690 for the example of FIG. 6.

TABLE 1

| Independent Banking Enable 690 | Bank Index 685 | Mux 640 Outputs Even Bits of the Output from: | Mux 650 Outputs Odd Bits of the Output from: |
| --- | --- | --- | --- |
| 0 | 0 | Bank 610 | Bank 610 |
| 0 | 1 | Bank 620 | Bank 620 |
| 1 | 0 | Bank 610 | Bank 620 |
| 1 | 1 | Bank 620 | Bank 610 |

Table 1 illustrates that bank index 685 selects which bank outputs the addressed memory for banked operation (as in FIG. 3), and selects which subset of bits from each bank is combined to output the addressed memory for bit-separated operation (as in FIG. 4). It is noted that the output bits are referred to as "odd" and "even" in this context because there are two banks, however a smaller subset of bits can be output from corresponding rows of each bank in implementations with a greater number of banks (and greater bit separation, as in FIG. 5).

Independent banking enable 690 is generated in any suitable manner. For example, memory 600 is instantiable in different processors intended for distribution to server customers desiring higher reliability and gaming users desiring higher performance. In some cases, independent banking enable 690 is hard wired to the appropriate level in each processor to set memory 600 for banked or bit separation mode. In another example, memory 600 is instantiable in a processor that is intended for both server customers and gaming users. In some cases, independent banking enable 690 is permanently set to the appropriate value via fusing, or is made configurable by tying it to a suitable register or pin. In cases where banking enable 690 is made configurable, its value is settable, for example, in a basic input-output system (BIOS), dynamically by a software application, or in any other suitable manner.

Bank index 685 is generated in any suitable manner. For example, in some implementations, memory management hardware asserts the appropriate value of bank index 685 for a particular memory access. In some implementations, bank index 685 is a least significant bit, or other bit, of address 630 or 635, depending on which address is asserted for the current operation. In bit-separated operation, both address 630 and 635 will have the same value, as both of banks 610 and 620 must be accessed to recover data stored in bit separated manner across banks 610 and 620. In banked operation, address 630 and 635 will have different values, as different data from each of banks 610 and 620 is simultaneously accessible some implementations. The bank index 685 will be the same for both addresses however, since both addresses must indicate banked operation to read data from one bank.

It is noted that while memory 600 is configurable between a configuration with a banking of 2 and a bit separation of 2, and a configuration with no banking and a bit separation of 4, as described above, other implementations are configurable with different bankings and/or bit separations. For example, other implementations provide configurability between a configuration with a banking of 4 and a bit separation of 2, and a configuration with no banking and a bit separation of 8. In such implementations, the corresponding bank index would be 2 bits wide to accommodate selection among 4 banks, or of bits from among 8 different memory entries across the 4 banks. The independent banking enable signal would remain one bit wide however, to select between the two possible configurations (i.e., banked mode and bit separated mode).

Figure 7:
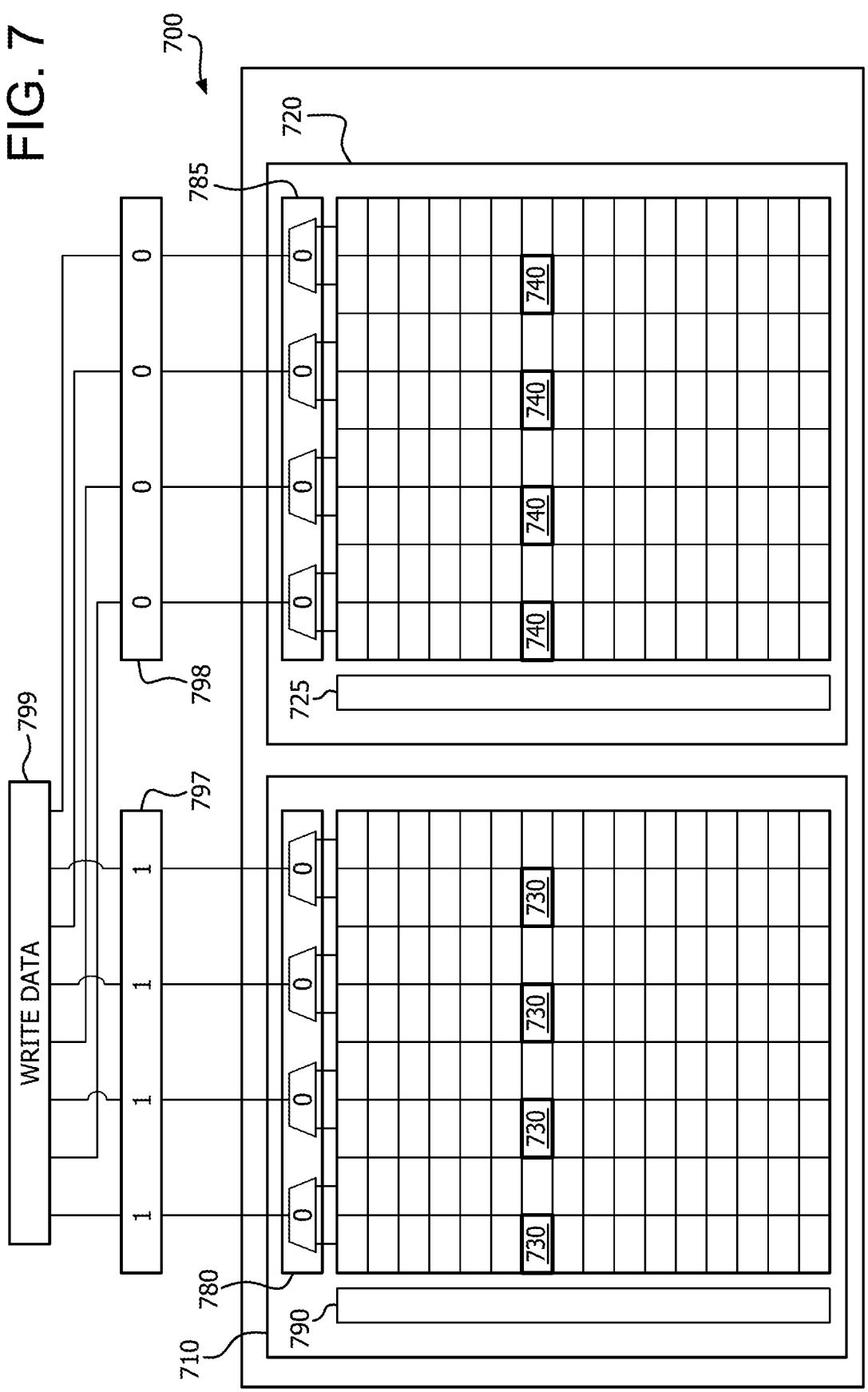
FIG. 7 is a schematic diagram illustrating an example memory configurable for banked or bit-separated write operations.

FIG. 7 is a block diagram illustrating an example memory 700. Memory 700 is identical to memory 300, as shown and described with respect to FIG. 3, except in that it includes example write circuitry, and omits read-specific circuitry. Memory 700 is configured for banked write operations, and is implemented in any suitable way, using any suitable hardware components.

Memory 700 stores memory entries in rows and columns of memory devices (e.g., RAM). In this example, memory 700 includes two banks 710, 720 of such memory devices. Memory 700 also includes row decoders 790, 795 and column demultiplexers 780, 785. Memory devices are selected for access (e.g., writing in this example) by addressing the row and column at which each of the desired memory devices are located in memory 700.

A memory device is writable, for example, by inputting address bits corresponding to a row or rows to row decoders 790, 795, and by inputting address bits corresponding to a column or columns to column input demultiplexers 780, 785. In this example, the address bits are portions of an address of a memory entry to be written to memory 700.

The address or portion of an address applied to row decoders 790, 795 is referred to as a row address, and the address or portion of an address applied to column input demultiplexers 780, 785 can be referred to as a column address. In this example, the bits of the row address set decoding circuitry in the row decoders 790, 795 to select a particular row or rows of banks 710 and 720 for writing, and the bits of the column address set demultiplexing circuitry in the column demultiplexers 780, 785 to select a particular column or columns of banks 710 and 720 for writing.

The information to be stored at the corresponding row and column in memory 700 (i.e., write data 799) is input to write drivers 797, 798, which are addressed to select either bank 710 or bank 720 for input. Write drivers 797, 798 are shown as two units merely for ease of description. It is noted that a corresponding write mask could alternately be described as a single unit which includes multiple write drivers, or could be described in terms of a plurality of separate write drivers. The address or portion of an address applied as a select signal to write drivers 797, 798 is referred to as a bank index. Because there are two banks in this example, the bank index is a single bit. However any suitable number of bits is usable in other implementations. In some implementations, the bank index is the least significant bit (LSB) of the address of the desired memory entry. Write drivers 797, 798 are located outside of memory 700 in this example. However in some implementations write drivers 797, 798 are located inside of memory 700.

To illustrate an example operation, it is desired to write the write data 799 as a memory entry 730, which is to be stored completely in even columns of a single row of bank 710, interleaved with other memory entries. A different memory entry 740 is stored completely in bank 720 (i.e., at column and row addresses corresponding to memory entry 730). In this example, a subset of address bits corresponding to the row address for memory entry 730 is input to row decoder 790 and a different subset of the address bits corresponding to the column address of memory entry 730 is input to column input demultiplexer 780. In this example, column input demultiplexers 780 include several 1:2 demultiplexers which each select either an odd column, or even column, of bank 710. Accordingly, the column address for memory entry 730 is used to set each demultiplexer of column input demultiplexers 780 to write to the even columns of bank 710, illustrated in FIG. 7 by an select value of "0" for each of the demultiplexers, because entry 730 is stored in the even columns (starting with column 0) of the selected row of bank 710.

Because write data 799 is to be stored completely in bank 710 at memory entry 730, write data 799 is written to memory entry 730 by inputting a bank index as a select signal to write drivers 797, 798 which sets all of the demultiplexers of write drivers 797, 798 to input the information to be stored at memory entry 730 to bank 710 only. This is illustrated in FIG. 7 by an enable value of "1" for each of the write drivers 797, 798 coupled to the inputs of column input demultiplexers 780, and a value of "0" for each of the write drivers 797, 798 coupled to the inputs of column input demultiplexers 785. If it were desired to write to memory entry 740 in bank 720 instead, the bank index would set all of the enables of write drivers 797, 798 to the opposite enable values. The bank index is only one bit of the memory address in this example because there are only two banks. In other implementations, any suitable number of bits is usable for the bank index.

If it were instead desired to write the write data 799 to a memory entry in an increased bit-separation mode, at every other even column of bank 720, and the alternate even columns of bank 730 (similar to FIG. 4), such memory entry would be written by inputting a bank index to write drivers 797, 798 which sets every other write driver of write drivers 797, 798 to input the bits of the information to be stored to bank 710 or bank 720, respectively. Thus, the leftmost write driver of write drivers 797, 798 would be set to input to bank 710, (e.g., using an enable value of "1"). The next leftmost multiplexer of write drivers 797, 798 would be set not to input to bank 710 (e.g., using an enable value of "0"). The enable values of each write driver of write drivers 797, 798 would alternate accordingly. The bank index is only one bit of the memory address in this example because the bit separation of each memory entry would require only two enable settings for write drivers 797, 798; e.g., "10101010" or "01010101". In other implementations, any suitable number of bits is usable for the bank index. It is noted that analogous write circuitry would also apply to a memory with additional banks, such as memory 500 as shown and described with respect to FIG. 5.

Figure 8:
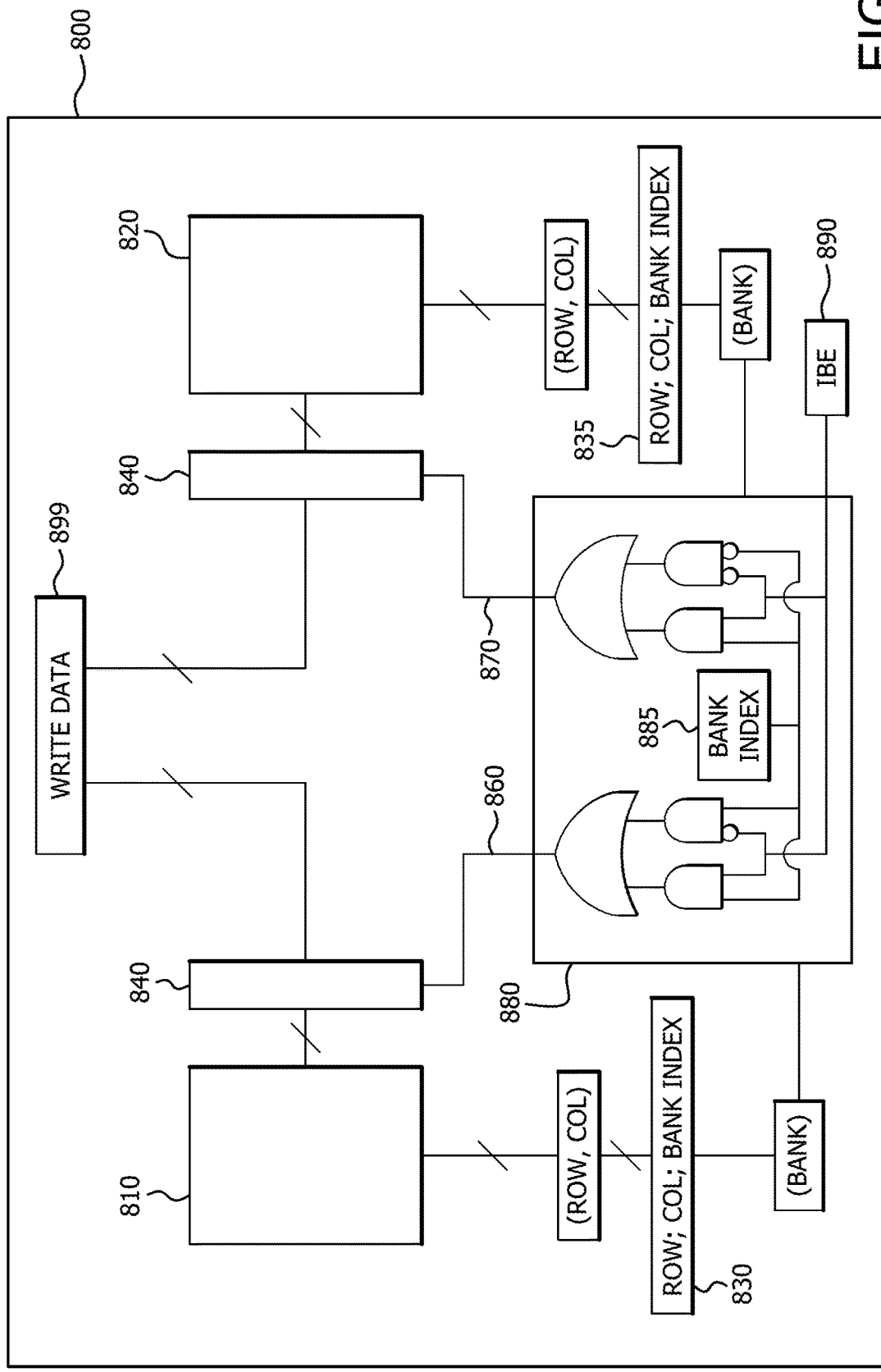
FIG. 8 is a schematic diagram illustrating another example memory configurable for banked or bit-separated write operations.

FIG. 8 is a schematic diagram illustrating a memory 800, similar to memories 300, 400, and 700, as shown and described with respect to FIGS. 3, 4, and 7. Memory 800 is identical to memory 600, as shown and described with respect to FIG. 6, except in that it describes the corresponding write circuitry, and omits read-specific circuitry. The write circuitry facilitates configurability between banked write operation (e.g., as illustrated by FIG. 3) and increased bit separated write operation (e.g., as illustrated by FIG. 4). Such configurability is applicable to memories 300, 400, 500, and 700 as shown and described with respect to FIGS. 3, 4, 5, and 7, or any other suitable memory. In some cases, such configurability has the advantage of enabling users to configure the tradeoff between performance and robustness, of enabling programs to dynamically configure the tradeoff, or of enabling the chip manufacturer to bin processors for different markets, for example. In some implementations, configuring or reconfiguring memory 800 between banked operation and increased bit separated operation is performed at boot time, or following a memory flush, in order to avoid data corruption.

Memory 800 includes bank 810 and bank 820. The rows and columns of banks 810 and 820 are both accessed by inputting a subset of the bits of memory address 830 or memory address 835 to row decoders and column multiplexers of banks 810 and 820 respectively.

Each of banks 810, 820 stores write data 899 to memory devices at memory lines and columns corresponding to address 830 and 835, respectively, via write drivers 840.

Write drivers 840 input write data 899 to either bank 810 or bank 820 (or both), depending on enable signals 860 and 870. Write drivers 840 are shown as two units merely for ease of description. It is noted that a corresponding write mask could alternately be described as a single unit which includes multiple write drivers, or could be described in terms of a plurality of separate write drivers.

Write driver select signals 860, 870 are generated by configuration circuitry 880 based on bank index signal 885, and independent banking enable (IBE) signal 890. In this example, bank index signal 885 is a subset of the address bits (e.g., one bit) of address 830 or address 835, depending on which address is being used in the operation. Independent banking enable signal 890 sets configuration circuitry 880 to use bank index signal 885 either as a bank select (as in the analogous banked read operation of FIG. 3) or to select which bits of each bank will be written with the write data (as in the analogous bit-separated read operation of FIG. 4). Configuration circuitry 880 is illustrated using an example combination of symbolic logic, however it is noted that any suitable logic is usable in other implementations.

In this example, independent banking enable signal 890 sets memory 800 to operate in either a banked mode, or an increased bit separation mode. Because there are two modes in this example, independent banking enable signal 890 is one bit wide. Bank index 885 sets which bank is written to by write drivers 840 in conditions where independent banking enable signal 890 configures memory 800 to operate in banked mode, and sets which bits are written to corresponding row addresses of both bank 810 and bank 820 in conditions where independent banking enable signal 890 configures memory 800 to operate in increased bit separation mode. Because there are two banks in this example, bank index 885 is one bit wide. Table 1 illustrates the possible combinations of bank index signal 885 and independent banking enable signal 890.

TABLE 2

| Independent Banking Enable 890 | Bank Index 885 | Write Drivers 840 Input Even Bits of Write Data 899 to: | Write Drivers 840 Input Odd Bits of Write Data 899 to: |
| --- | --- | --- | --- |
| 0 | 0 | Bank 810 | Bank 810 |
| 0 | 1 | Bank 820 | Bank 820 |
| 1 | 0 | Bank 810 | Bank 820 |
| 1 | 1 | Bank 820 | Bank 810 |

Table 2 illustrates that bank index 885 selects to which bank write data 899 is written for banked operation (as in the analogous read operation in FIG. 3), and selects to which subset of bits of both banks the write data 899 is written for bit-separated operation (as in the analogous write operation in FIG. 4). It is noted that the input bits are referred to as "odd" and "even" in this context because there are two banks; however a smaller subset of bits can be input to corresponding rows of each bank in implementations with a greater number of banks (and greater bit separation).

Independent banking enable 890 is generated in any suitable manner. For example, memory 800 is instantiable in different processors intended for distribution to server customers, desiring higher reliability, and gaming users, desiring higher performance. In some cases, independent banking enable 890 is hard wired to the appropriate level in each processor to set memory 800 for banked or bit separation mode. In another example, memory 800 is instantiable in a processor that is intended for both server customers and gaming users. In some cases, independent banking enable 890 is permanently set to the appropriate value via fusing, or is made configurable by tying it to a suitable register or pin. In cases where banking enable 890 is made configurable, its value is settable, for example, in a basic input-output system (BIOS), dynamically by a software application, or in any other suitable manner.

Bank index 885 is generated in any suitable manner. For example, in some implementations, memory management hardware asserts the appropriate value of bank index 885 for a particular memory access. In some implementations, bank index 885 is a least significant bit, or other bit, of address 830 or 835, depending on which address is asserted for the current operation. In bit-separated operation, both address 830 and 835 will have the same value, as both of banks 810 and 820 must be accessed to write data in bit separated manner across banks 810 and 820. In banked operation, address 830 and 835 will have different values, as different data is writable to each of banks 810 and 820 simultaneously in some implementations. The bank index 885 will be the same for both addresses however, since both addresses must indicate banked operation to read data from one bank.

It is noted that, typically, the configuration circuitry 880, including the output and input signal lines, is the same circuitry used for the corresponding read operations (i.e., is the same as configuration circuitry 680 as shown and described with respect to FIG. 6). It is described separately with respect to the read operations for clarity in the example of FIG. 8.

It is noted that while memory 800 is configurable between a configuration with a banking of 2 and a bit separation of 2, and a configuration with no banking and a bit separation of 4, as described above, other implementations are configurable with different bankings and/or bit separations. For example, other implementations provide configurability between a configuration with a banking of 4 and a bit separation of 2, and a configuration with no banking and a bit separation of 8. In such implementations, the corresponding bank index would be 2 bits wide to accommodate selection among 4 banks, or of bits from among 8 different memory entries across the 4 banks. The independent banking enable signal would remain one bit wide however, to select between the two possible configurations (i.e., banked mode and bit separated mode).

FIGS. 6 and 8 illustrate example configurability between banked operation and bit-separated operation; however any suitable realization of this configurability in hardware and/or software is possible.

Figure 9:
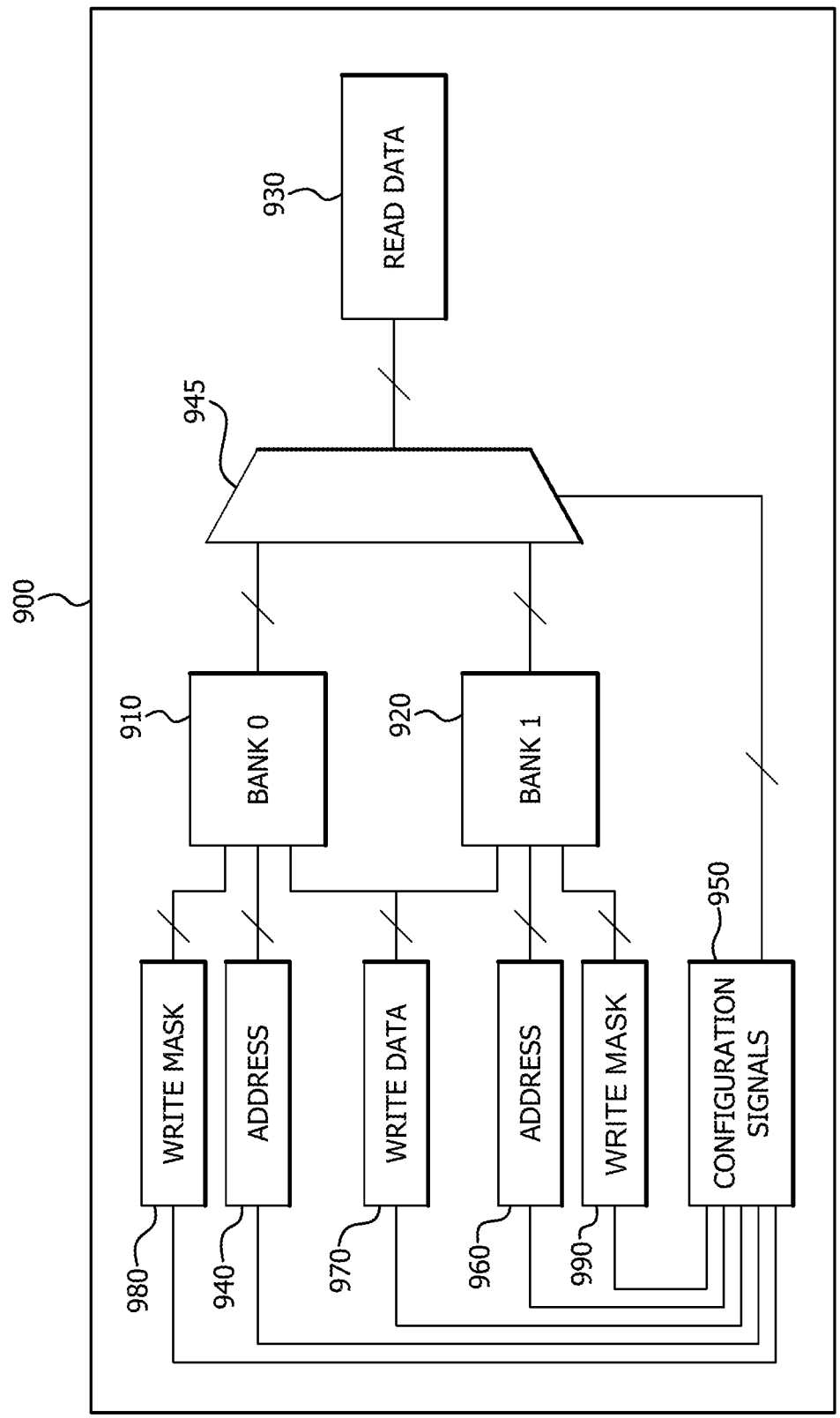
FIG. 9 is a schematic diagram illustrating another example memory which includes example circuitry for configurability between banked or bit separated read and write operations.

For example, FIG. 9 is a schematic diagram illustrating a memory 900 which includes example circuitry facilitating configurability between banked operation and bit separated operation.

Memory 900 includes bank 910 and bank 920. For read operations, read data 930 is read from bank 910, bank 920, or both, depending on whether memory 900 is operating in banked or bit-separated mode. For write operations, write data 970 is written to bank 910, bank 920, or both, depending on whether memory 900 is operating in banked or bit-separated mode.

To output read data 930 from bank 910 in banked mode (similar to the operation of FIG. 3), bits of address 940 are input to a row decoder and column multiplexers of bank 910, configuring bank 910 to output read data 930 from a subset of the data devices in bank 910 to bank multiplexers 945. Bank multiplexers are configured by configuration signals 950 to output read data 930 from bank 910 only, based on the banked mode of operation and a bit or bits of the address 940 corresponding to a bank index.

Similarly, to output read data 930 from bank 920 in banked mode, bits of address 960 are input to a row decoder and column multiplexers of bank 920, configuring bank 920 to output read data 930 from a subset of the data devices in bank 920 to bank multiplexers 945. Bank multiplexers are configured by configuration signals 950 to output read data 930 from bank 920 only, based on the banked mode of operation and a bit or bits of the address 960 corresponding to a bank index. In some implementations, different read data can be output from each bank simultaneously in banked mode.

To output read data 930 from banks 910, 920 in bit-separated mode (similar to the operation of FIG. 5), bits of address 940, 960 are input to a row decoder and column multiplexers of banks 910, 920, configuring banks 910, 920 to output read data 930 from a subset of the data devices in both banks 910 and 920 to bank multiplexers 945. Address 940, 960 are the same address in bit-separated mode. Bank multiplexers are configured by configuration signals 950 to output read data 930 from both of banks 910, 920, based on the bit-separated mode of operation and a bit or bits of the address 940 corresponding to a bank index.

To input write data 970 to bank 910 in banked mode (similar to the operation of FIG. 7), bits of address 940 are input to a row decoder and column multiplexers of bank 910, configuring bank 910 to input write data 970 to a subset of the data devices in bank 910. A write mask 980, which includes various write drivers, is configured by configuration signals 950 to input write data 970 to bank 910 only, based on the banked mode of operation and a bit or bits of the address 940 corresponding to a bank index.

Similarly, to input write data 970 to bank 920 in banked mode, bits of address 960 are input to a row decoder and column multiplexers of bank 920, configuring bank 920 to input write data 970 to a subset of the data devices in bank 920. A write mask 990, which includes various write drivers, is configured by configuration signals 950 to input write data 970 to bank 920 only, based on the banked mode of operation and a bit or bits of the address 960 corresponding to a bank index.

To input write data 970 to both banks 910, 920 in bit-separated mode (also described with respect to FIG. 7), bits of address 940, 960 are input to a row decoder and column multiplexers of banks 910, 920, configuring banks 910, 920 to input write data 970 to a subset of the data devices in both banks 910 and 920. Address 940, 960 are the same address in bit-separated mode. Write masks 980, 990 are configured by configuration signals 950 to input write data 970 to both of banks 910, 920, based on the bit-separated mode of operation and a bit or bits of the address 940 corresponding to a bank index.

It is noted that in various implementations, various components described herein are implemented, considered, or otherwise described as on or off the memory as desired. For example, write masks 980, 990, bank multiplexers 945, and configuration signals 950 can be considered to be a part of memory 900 as shown, or could be considered to be external to memory 900, either in fact (e.g., implemented on a separate die) and/or logically.

Figure 10:
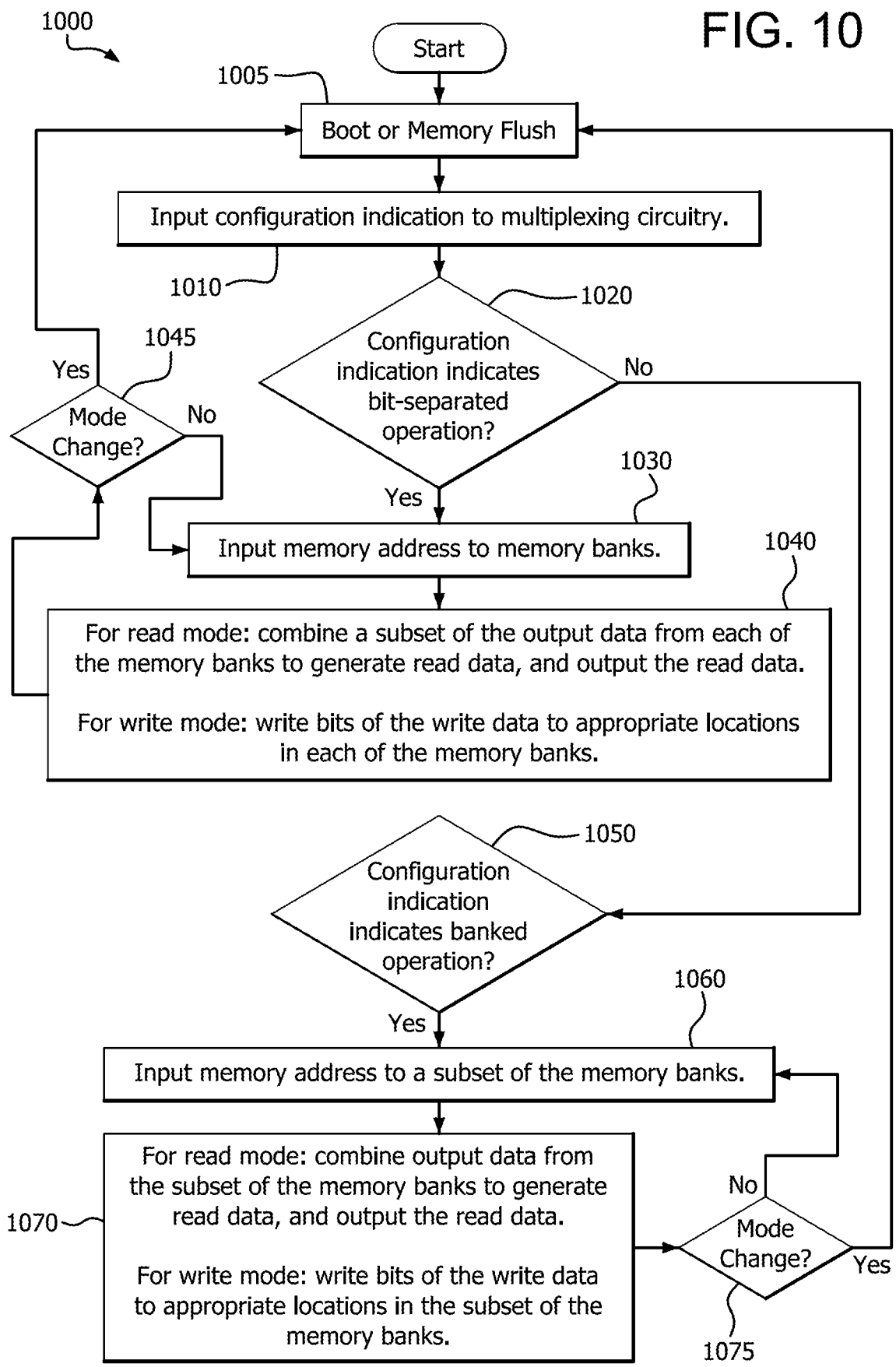
FIG. 10 is a flow chart illustrating an example method for configuring a memory for banked or bit separated operation.

FIG. 10 is a flow chart illustrating an example method 1000 for configuring a memory for banked or bit separated operation. Method 1000 is implemented in any suitable way (e.g., using memory 900 or memory 600 as shown and described with respect to FIGS. 9 and 6 respectively).

In step 1005, the memory is cleared as part of a system boot, memory flush, or another suitable action. In some implementations, this is performed in order to avoid corruption in data stored in the memory. In step 1010, an input configuration information is input to multiplexing circuitry (or any suitable selection circuitry as further described herein).

On a condition 1020 that the configuration information indicates bit-separated operation (e.g., by an independent banking enable signal as discussed herein), a memory address is input to the memory banks in step 1030, and data is read from the memory in a read mode, or written to the memory in a write mode, in step 1040. For read mode, read data is generated at step 1040 by combining a subset of the output data from each of the memory banks. For example, if there are two memory banks and a bit separation of 2, odd bits from one of the banks are combined with even bits of the other bank to generate the read data, and the read data is output from the memory. Which of the bits are combined are also based on the configuration information (e.g., the bank index as discussed herein). For write mode, write data is written to the memory in step 1040 by writing bits of the write data to appropriate locations in each of the memory banks. For example, if there are two memory banks and a bit separation of 2, odd bits of the write data are written to one of the memory banks, and even bits of the write data are written to the other memory bank. The appropriate locations in each of the memory banks are based on the configuration information, as discussed herein.

On condition 1045 that a mode change occurs from bit-separated operation to banked operation, the flow returns to step 1005 where memory is flushed. Otherwise, the flow returns to step 1030, where the next memory address is input to the memory banks. Without implying any other steps to be strictly necessary, it is noted that in some implementations the mode is set at boot time, or during manufacturing, and there is no run-time mode change condition 1045.

On condition 1020 that the configuration information does not indicate bit-separated operation (i.e., indicates a banked operation condition 1050, e.g., by an independent banking enable signal), a memory address is input to a subset of the memory banks (e.g., only one bank) in step 1060, and data is read from the memory in a read mode, or written to the memory in a write mode, in step 1070. For clarity, it is noted that since there are only two modes of operation (i.e., banked and bit-separated) condition 1050 always indicates banked operation on condition 1020 that the configuration indication does not indicate bit-separated operation. Accordingly, there is no negative condition to condition 1050. For read mode, in an example where there are two banks, read data is generated at step 1070 by selecting both even and odd bits from only one of the banks, and the read data is output from the memory. Which of the banks is read from is also based on the configuration information (e.g., a bank index as discussed herein). For write mode, write data is written to the memory in step 1070 by writing bits of the write data to even and odd bits in only one of the banks Which of the banks is written to is also based on the configuration information (e.g., a bank index as discussed herein).

On condition 1075 that a mode change occurs from banked operation to bit-separated operation, the flow returns to step 1005 where memory is flushed. Otherwise, the flow returns to step 1060, where the next memory address is input to the subset of the memory banks. Without implying any other steps to be strictly necessary, it is noted that in some implementations the mode is set at boot time, or during manufacturing, and there is no run-time mode change condition 1075.

It should be understood that many variations are possible based on the disclosure herein. Although features and elements are described above in particular combinations, each feature or element can be used alone without the other features and elements or in various combinations with or without other features and elements.

The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be creating masks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A system configurable to operate in either a banked mode or a bit-separated mode, the system comprising:
    a plurality of memory banks;
    multiplexing circuitry; and
    input circuitry configured to input at least a portion of a memory address to the multiplexing circuitry, and to input configuration information to the multiplexing circuitry;
    the multiplexing circuitry configured to, if the configuration information indicates a bit-separated mode: generate read data by combining a selected subset of data corresponding to the memory address from each of the plurality of memory banks, the subset selected based on the configuration information;
    the multiplexing circuitry further configured to, if the configuration information indicates a banked mode: generate the read data by combining data corresponding to the memory address from one of the memory banks, the one of the memory banks selected based on the configuration information; and output circuitry configured to output the generated read data.

2. The system of claim 1, further comprising circuitry configured to change between the bit-separated mode and the banked mode responsive to the configuration information.

3. The system of claim 1, wherein the configuration information is set at boot time, during manufacturing, and/or during run time.

4. The system of claim 1, wherein, if the configuration information indicates the bit-separated mode: the configuration information comprises a bank index, and the bank index indicates the subset; and if the configuration information indicates the banked mode: the configuration information comprises a bank index, and the bank index indicates the one of the plurality of memory banks.

5. The system of claim 1, wherein the multiplexing circuitry is further configured to, if the configuration information indicates the bit-separated mode: generate odd bits of the read data from one of the memory banks, and even bits of the read data from another of the memory banks.

6. A method for reading data in a system configurable to operate in either a banked mode or a bit-separated mode, the method comprising:
inputting at least a portion of a memory address to multiplexing circuitry;
inputting configuration information to the multiplexing circuitry;
if the configuration information indicates a bit-separated mode: generating read data by combining a selected subset of data corresponding to the memory address from each of a plurality of memory banks, the subset selected by the multiplexing circuitry based on the configuration information;
if the configuration information indicates a banked mode: generating the read data by combining data corresponding to the memory address from one of the memory banks, the one of the memory banks selected by the multiplexing circuitry based on the configuration information; and outputting the generated read data.

7. The method of claim 6, further comprising changing between the bit-separated mode and the banked mode responsive to the configuration information.

8. The method of claim 6, wherein the configuration information is set at boot time, during manufacturing, and/or during run time.

9. The method of claim 6, wherein if the configuration information indicates the bit-separated mode: the configuration information comprises a bank index, and the bank index indicates the subset; and if the configuration information indicates the banked mode: the configuration information comprises a bank index, and the bank index indicates the one of the plurality of memory banks.

10. The method of claim 6, further comprising, if the configuration information indicates the bit-separated mode: generating odd bits of the read data from one of the memory banks, and even bits of the read data from another of the memory banks.

11. A system that is configurable to operate in either a banked mode or a bit-separated mode, the system comprising:
a plurality of memory banks;
multiplexing circuitry; and
input circuitry configured to input write data to the multiplexing circuitry, to input at least a portion of a memory address to the multiplexing circuitry, and to input configuration information to the multiplexing circuitry;
the multiplexing circuitry configured to, if the configuration information indicates a bit-separated mode:
write a selected subset of the write data to each of the plurality of memory banks, the subset selected based on the configuration information; and
the multiplexing circuitry further configured to, if the configuration information indicates a banked mode: write the write data to a selected one of the plurality of memory banks, the one of the memory banks selected based on the configuration information.

12. The system of claim 11, further comprising circuitry configured to change between the bit-separated mode and the banked mode responsive to the configuration information.

13. The system of claim 11, wherein the configuration information is set at boot time, during manufacturing, and/or during run time.

14. The system of claim 11, wherein if the configuration information indicates the bit-separated mode: the configuration information comprises a bank index, and the bank index indicates the subset; and if the configuration information indicates the banked mode: the configuration information comprises a bank index, and the bank index indicates the one of the plurality of memory banks.

15. The system of claim 11, wherein the multiplexing circuitry is further configured to, if the configuration information indicates the bit-separated mode: write odd bits of the write data to one of the memory banks, and even bits of the write data to another of the memory banks.

16. A method for writing data in a system that is configurable to operate in either a banked mode or a bit-separated mode, the method comprising:
inputting write data to multiplexing circuitry;
inputting at least a portion of a memory address to the multiplexing circuitry;
inputting configuration information to the multiplexing circuitry;
if the configuration information indicates a bit-separated mode: writing a selected subset of the write data to each of a plurality of memory banks, the subset selected by the multiplexing circuitry based on the configuration information; and
if the configuration information indicates a banked mode: writing the write data to a selected one of the plurality of memory banks, the one of the plurality of memory banks selected by the multiplexing circuitry based on the configuration information.

17. The method of claim 16, further comprising changing between the bit-separated mode and the banked mode responsive to the configuration information.

18. The method of claim 16, wherein the configuration information is set at boot time, during manufacturing, and/or during run time.

19. The method of claim 16, wherein if the configuration information indicates the bit-separated mode: the configuration information comprises a bank index, and the bank index indicates the subset; and if the configuration information indicates the banked mode: the configuration information comprises a bank index, and the bank index indicates the one of the plurality of memory banks.

20. The method of claim 16, further comprising, if the configuration information indicates the bit-separated mode: writing odd bits of the write data to one of the memory banks, and writing even bits of the write data to another of the memory banks.

* * * * *